US008533655B1

(12) United States Patent
Konduru (10) Patent No.: US 8,533,655 B1
(45) Date of Patent: Sep. 10, 2013

(54) METHOD AND APPARATUS FOR CAPTURING DATA SAMPLES WITH TEST CIRCUITRY (75) Inventor: Samskrut J. Konduru, Hyderabad (IN)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/296,511

(22) Filed: Nov. 15, 2011

(51) Int. Cl.
G06F 17/50 (2006.01)

(52) U.S. Cl.
USPC .......................... 716/136; 716/113; 716/126

(58) Field of Classification Search
USPC ........................................ 716/113, 126, 136
See application file for complete search history.

(56) References Cited

U.S. PATENT DOCUMENTS 8,244,512 B1 * 8/2012 Tseng et al. .................... 703/14

* cited by examiner

Primary Examiner — Thuan Do
(74) Attorney, Agent, or Firm — LeRoy D. Maunu; Lois D. Cartier (57) ABSTRACT A method is provided for testing a circuit design in a programmable IC. The circuit design and a sampling circuit are implemented in the programmable IC. A first routing circuit is implemented in the programmable IC to route signals from the designated locations of a first subset of a set of test nodes of the circuit design to a set of input nodes of the sampling circuit. Signals are sampled from the first subset of test nodes using the sampling circuit. The programmable IC is partially reconfigured to implement a second routing circuit that replaces the first routing circuit. The second routing circuit is configured to route signals from a second subset of the set of test nodes to the set of input nodes of the sampling circuit. Signals from the second subset of test nodes are sampled using the sampling circuit.

20 Claims, 9 Drawing Sheets

METHOD AND APPARATUS FOR CAPTURING DATA SAMPLES WITH TEST CIRCUITRY

FIELD OF THE INVENTION

One or more embodiments generally relate to the testing of circuit designs.

BACKGROUND

Due to advancements in processing technology, complex integrated circuits (ICs) can be designed using various levels of abstraction. Using a hardware description language (HDL), circuits can be designed at the gate level, the register transfer level (RTL), and higher logical levels. When designing using an HDL, the design is often structured in a modular manner. The designer describes a module in terms of the behavior of a system, the behavior describing the generation and propagation of signals through combinatorial modules from one set of registers to another set of registers. HDLs provide a rich set of constructs to describe the functionality of a module. Modules may be combined and augmented to form even higher level modules.

An HDL design can be synthesized to create a logical network list (netlist), which can be implemented as an IC. Prior to implementation, the HDL design can be simulated or emulated to determine whether the design will function as required. Wasted manufacturing costs due to faulty design may thereby be avoided.

Simulation of a circuit design models the circuit design in a computer based environment to determine behavior of circuit design. The simulation uses models of transistors and other components called for by the design of the circuit. Simulation can be used to verify both the IC logic and timing. However, simulation can be very time-consuming and resource intensive since it is software-based.

In emulation, a circuit design and test circuitry are implemented in programmable logic of a programmable IC, such as a field programmable gate array (FPGA) or programmable logic device (PLD). In addition to the circuit design, the programmable logic is configured to implement test circuitry and routing circuitry. The test circuitry provides input stimuli and observes and/or analyzes output signals of the emulated circuit. The routing circuitry routes signals from specific locations (test nodes) of the circuit design to input nodes of the testing circuitry.

The operation of the circuit design can be verified by the test circuitry through analysis of signals sampled from the test nodes. The sampled data is output to a software-based test system that can display results to a user to facilitate debugging. In general, emulation is faster than simulation.

In many cases, programmable logic is utilized for implementation of the circuit design under test (DUT), leaving few, if any, logic resources free for the test and routing circuitry. To reduce the requirement for programmable resources, test circuitry may be reduced in some emulation systems by generating test input and performing analysis of sampled signals externally. For example, the generation of test input and analysis of output may be performed in a software-based testing system that is coupled to the IC. However, the signals from the test nodes in the programmable IC must still be distributed to external pins and a communication interface is needed to transmit data between the programmable IC and external testing system. Due the limited availability of programmable resources or communication bandwidth, it may not be possible to implement routing circuitry to route signals from all of the desired test nodes.

Some previous methods of emulation conduct testing using a limited number of routing circuits to test a selected portion, and/or using a selected subset of desired test nodes of an emulated circuit. Emulation is repeated over a large number of iterations—sampling data from different subset of desired test nodes with each iteration. After emulation is completed, a user or automated software testing program may want to repeat emulation for a different set of desired test nodes based on signals and/or timing data of monitored test nodes.

To configure the programmable IC before each iteration, the circuit design under test, test circuitry, and modified routing circuits are synthesized into a logical network list (netlist) that can be used to configure programmable resources of the programmable IC. The repeated netlist generation and configuration of the programmable IC contributes to a large portion of total emulation runtime.

One or more embodiments may address one or more of the above issues.

SUMMARY

In one embodiment, a method is provided for testing a circuit design in a programmable IC. The circuit design is implemented in programmable logic of the IC. The circuit design has a set of test nodes at designated locations in the programmable IC. A sampling circuit is implemented in the programmable IC to have a set of inputs nodes at designated locations in the programmable IC. The sampling circuit is configured to sample signals from the set of input nodes. A first routing circuit is implemented in the programmable IC. The first routing circuit is configured to route signals from the designated locations of a first subset of the set of the test nodes to the designated locations of the set of input nodes of the sampling circuit. Signals are sampled from the first subset of test nodes using the sampling circuit. The programmable IC is partially reconfigured to implement a second routing circuit that replaces the first routing circuit. The second routing circuit is configured to route signals from the designated locations of a second subset of the set of test nodes to the set of input nodes of the sampling circuit. Signals from the second subset of test nodes are sampled using the sampling circuit.

In another embodiment, a method is provided for configuring a programmable integrated circuit (IC) for emulation of a circuit design. The circuit design is implemented in a reconfigurable partition of programmable logic of the programmable IC. a plurality of modules of the circuit design are tested and, in response to detecting an error, one of the plurality of modules of the circuit design that is a root of the error is determined. In response to determining the one module that is the root of the detected error, testing of the one module is halted while continuing testing of other ones of the plurality of modules of the circuit design.

It will be appreciated that various other embodiments are set forth in the Detailed Description and Claims, which follow.

BRIEF DESCRIPTION OF THE DRAWINGS

FIG. 4-1 illustrates an example routing circuit that may be used to route signals in a first sampling iteration;

FIG. 4-2 illustrates an example routing circuit that may be used to route signals in a second sampling iteration;

FIG. 4-3 illustrates an example routing circuit that may be used to dynamically route different sets signals in different sampling iterations;

DETAILED DESCRIPTION

Emulation is often used for verification and debugging of circuit designs prior to implementation. However, there may be too few programmable resources available to implement both the circuit design and the testing and routing circuits in a programmable IC used for emulation. Whenever the number of signals to be observed exceeds the capacity of the testing or routing circuits, multiple iterations must be performed to capture the desired signals. Previous methods synthesize a new netlist for the programmable IC before each iteration. The repeated generating of the netlist and configuring of the programmable IC contributes to a large portion of total emulation runtime. One or more embodiments provide a method and system for emulation of a circuit design that reduces emulation runtime by reducing the number of programmable resources that are reconfigured in each iteration.

In one or more embodiments, a routing circuit, which routes signals from test nodes of a design under test (DUT) to test circuitry of the emulation system, is implemented in reconfigurable programmable resources. Before each iteration of the emulation, the routing circuit may be reconfigured, via partial reconfiguration, to route a new subset of test nodes to the test circuitry. This avoids having to recompile the entire design in combination with the test circuitry and reconfigure the entire programmable IC with each iteration. Because only a small portion of the programmable IC is reconfigured with each iteration, emulation runtime is reduced.

Figure 1:
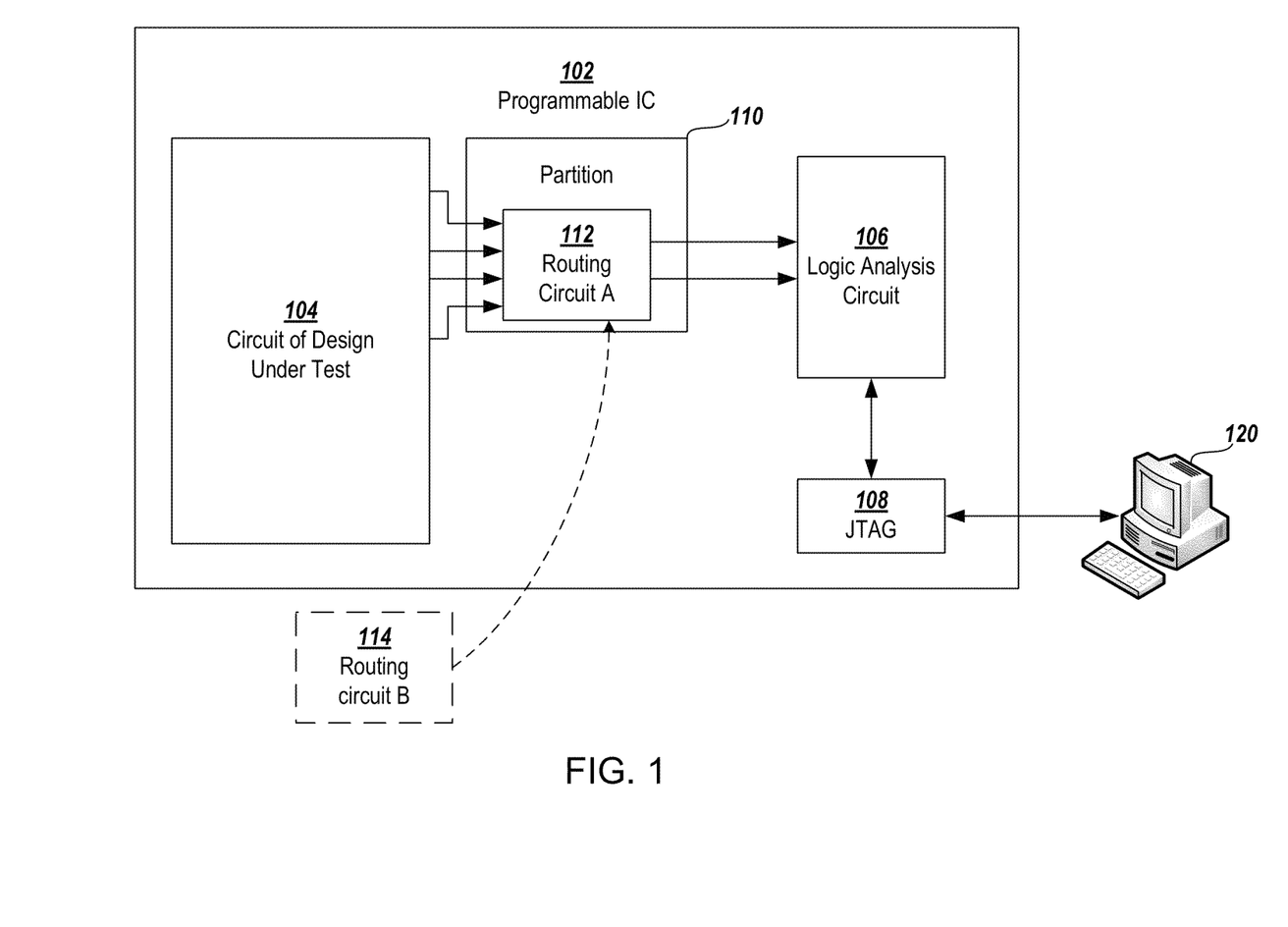
FIG. 1 illustrates an example emulation system implemented on a programmable IC in accordance with one or more embodiments.

FIG. 1 illustrates an example emulation system implemented on a programmable IC, in accordance with one or more embodiments. The programmable IC 102 is configured with an implementation of a circuit design under test 104 in programmable logic. The programmable IC 102 includes a logic analysis circuit 106 for sampling signals routed from various nodes of the circuit 104. The logic analysis circuit may be implemented in ASIC circuitry or programmable logic of the programmable IC 102. In one or more embodiments, the logic analysis circuit may also be implemented external to the programmable IC 102.

Data is sent via JTAG communication interface 108, between the logic analysis circuit 106 and an external testing system/controller 120, which is used to coordinate the emulation of the circuit design under test. The external testing system/controller 120 may also sample and/or analyze emulation data. In this example, the emulation system includes a communication interface configured to send and receive data to/from the programmable IC using the JTAG protocol, which is described in the IEEE 1149.1 specification. It is recognized that other communication protocols may be suitable for communication with external devices.

Signals are routed by one or more routing circuits 112 from selected nodes of the circuit design under test 104 to the logic analysis circuit 106 for sampling. The routing circuits 112 are implemented in a partition of 110 of programmable logic of the programmable IC 102 that may be reconfigured, via partial reconfiguration, independently of other programmable logic of the programmable IC. For ease of reference, a partition that may be reconfigured, via partial reconfiguration, independently of other programmable logic may be referred to as a reconfigurable partition. The logic analysis circuit is configured to sample signals from the selected set of nodes of the circuit 104 over a plurality of sampling iterations. In each iteration, a different subset of the nodes is sampled. Because only a subset of nodes is sampled in a sampling iteration, fewer programmable/ASIC resources are required to implement the routing circuit 112 and logic analysis circuit 106 than would be required if all the nodes of circuit 104 were sampled in one iteration.

After signals from a first subset of nodes have been sampled by the logic analysis circuit 106 in a first sampling iteration, the reconfigurable partition 110 may be reconfigured, via partial reconfiguration, to implement a second routing circuit 114 in order to route signals from a second subset of the nodes to the logic analysis circuit 106. Because only the reconfigurable partition 110 is reconfigured after each sampling iteration, netlist generation time, reconfiguration time and total emulation runtime are reduced. For ease of reference, netlist generation time and/or reconfiguration time may be jointly or individually referred to as "idle time."

Figure 2:
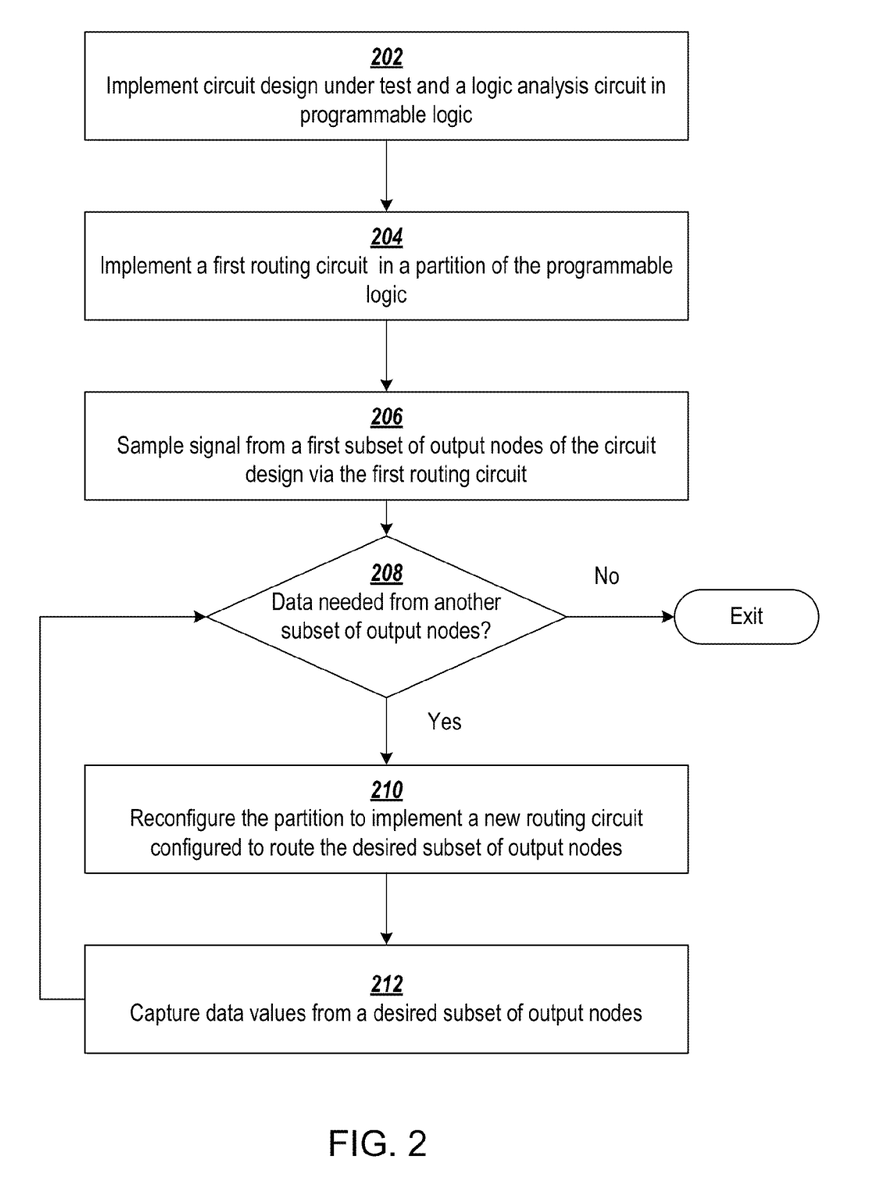
FIG. 2 shows a flowchart of a process for performing in-circuit analysis using reconfigurable routing circuitry.

FIG. 2 shows a flowchart of a process for performing in-circuit analysis using reconfigurable routing circuitry. A circuit design under test and a logic analysis circuit are implemented in programmable logic of the programmable IC at block 202. A first routing circuit is implemented in a reconfigurable partition of the programmable logic at block 204. Signals from a first subset of nodes of the circuit design are routed by the first routing circuit from the first subset of nodes to the logic analysis circuit and sampled by the logic analysis circuit at block 206.

If additional data needs to be sampled from other nodes of the circuit design under test at decision block 208, the reconfigurable partition is reconfigured at block 210 to implement a new routing circuit. The new routing circuits routes signals from the desired subset of output nodes to the logic analysis circuit. Signals are sampled from the desired subset of output nodes at block 212. The process continues sampling and reconfiguring the routing circuit until decision block 208 determines that emulation is complete.

In some embodiments, the programmable IC may include multiple partitions that may be separately reconfigured via partial reconfiguration. These multiple partitions may contain routing circuitry that can be interconnected and separately reconfigured. For example, outputs of a routing circuit in a first partition can be connected to inputs of routing circuits in a second partition, outputs of a routing circuit in the second partition can be connected to inputs of routing circuits in a third partition and so on, with the outputs of a last routing circuit in the path connected to inputs of the logic analyzer.

Figure 3:
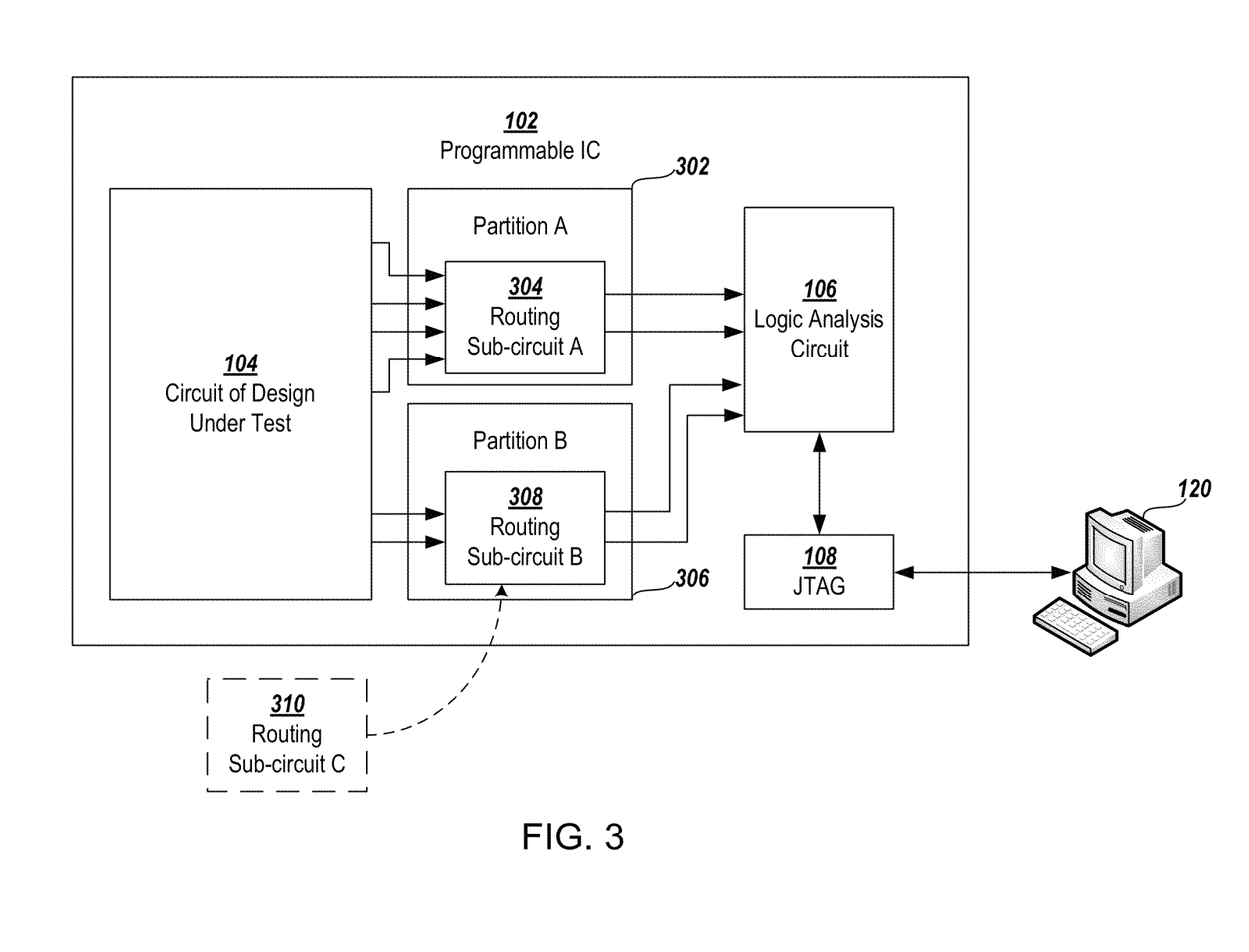
FIG. 3 shows the programmable IC shown in FIG. 1 with two routing sub-circuits implemented in respective partitions of reconfigurable programmable logic.

For example, FIG. 3 shows the programmable IC shown in FIG. 1 with two routing sub-circuits implemented in respective partitions of reconfigurable programmable logic. Routing sub-circuit A (304) is implemented in reconfigurable partition A (302) and routing sub-circuit B (308) is implemented in reconfigurable partition B (306). This allows routing sub-circuits A and B to be reconfigured independent of each other during sampling. For example, based on timing data of the signals sampled by the logic analysis circuit, a design tool or user 120 conducting the emulation may decide to modify routing sub-circuit 308 to sample one or more different testing nodes of the circuit 104, but leave routing sub-circuit 304 unchanged. As another example, if a testing node routed by a sub-circuit is determined to be on a critical path of the circuit design, the design tool or user 120 may reconfigure the routing sub-circuit to implement a plurality of pipeline stages. The pipeline stages (not shown) allow timing between testing nodes of the circuit design under test 104 and inputs of the logic analysis circuit 106. Timing may be improved so that more accurate data samples of the identified test node can be captured. In either example, because the routing sub-circuit 308 is implemented in its own partition, reconfiguration will take less time than would be required to reconfigure the both reconfigurable partitions 302 and 306 of programmable logic.

In some other embodiments, two reconfigurable partitions may be alternately reconfigured every other sampling iteration. For example, routing circuit 308 may currently be in use in a first sampling iteration. When the first sampling iteration is completed, sampling is started using the signals routed by routing circuit A (304). Concurrent with the sampling using routing circuit A (304), reconfigurable partition 306 may be reconfigured to implement routing circuit C (310) for the next sampling iteration. In this manner, idle time of the logic analysis circuit, and therefore, emulation runtime may be reduced.

Figure 41:
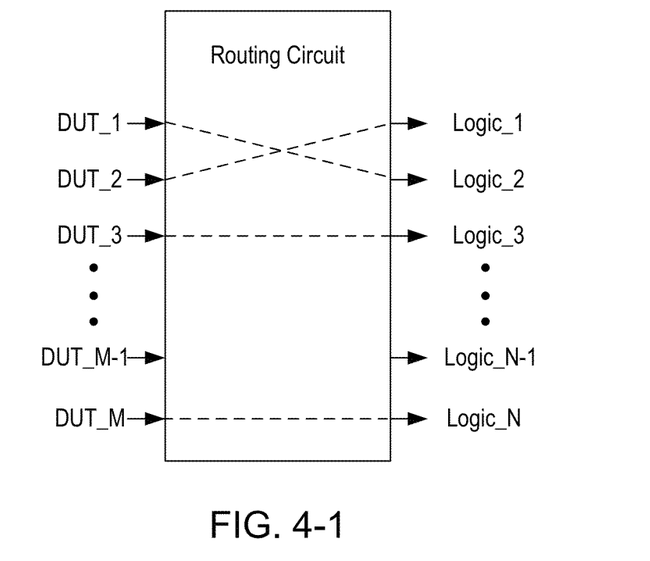
Figure 42:
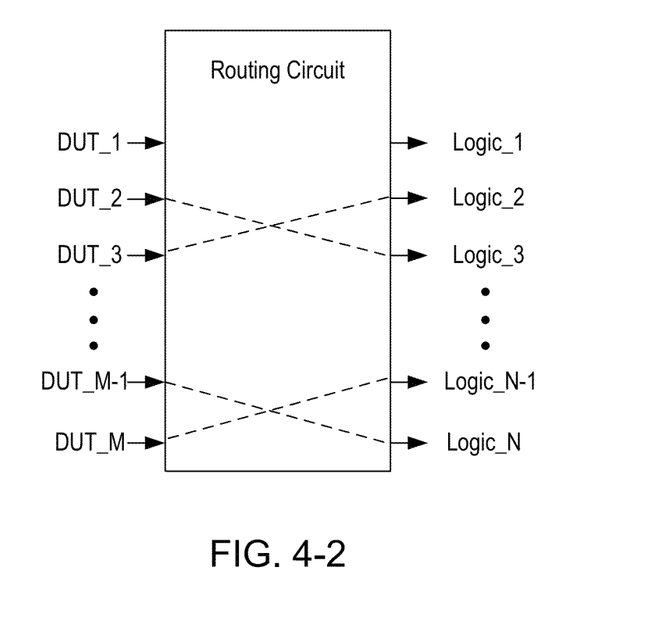
Figure 43:
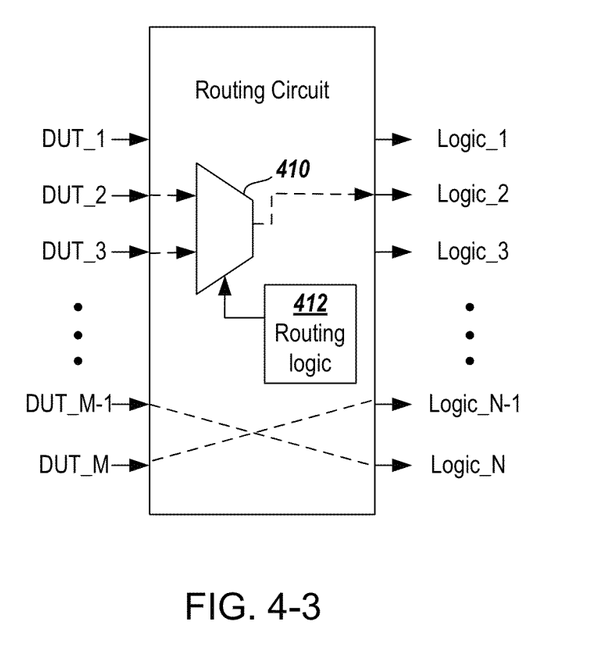

FIGS. 4-1 through 4-3 provide illustrative examples of routing circuit modules that may be implemented with routing circuitry in a reconfigurable partition of programmable logic in different sampling iterations. The modules implement a number of circuit paths (indicated by dashed lines) to route four signals from a subset of test nodes (DUT_1 through DUT_M) to a set or subset of inputs of a logic analysis circuit (Logic_1 though Logic_N).

FIG. 4-1 illustrates an example routing circuit that may be used to route signals in a first sampling iteration. In this example, signals are respectively routed from test nodes DUT_1, DUT_2, DUT_3, and DUT_M to nodes Logic_2, Logic 1, Logic 3, and Logic N of the logic analysis circuit.

FIG. 4-2 illustrates an example routing circuit that may be used to route signals in a second sampling iteration. In this example, circuit paths are reconfigured to respectively route signals from test nodes DUT_2, DUT_3, DUT_M−1, and DUT_M to nodes Logic_3, Logic 2, Logic N, and Logic N−1 of the logic analysis circuit.

The examples shown in FIGS. 4-1 and 4-2 include statically defined circuit paths that are implemented using programmable routing resources in the reconfigurable partition of the programmable IC. In some embodiments, the circuit paths circuitry may be implemented using switching and logic circuitry that may dynamically route signals over multiple sampling iterations. For example, FIG. 4-3 illustrates an example routing circuit that may be used to dynamically route different sets signals in different sampling iterations. In this example, the routing circuit is configured to implement two static circuit paths, which respectively route signals from test nodes DUT_M−1, and DUT_M to input nodes Logic N, and Logic N−1, and a dynamic routing circuit to route a signal from either DUT_2 or DUT_3 to Logic 2 of the logic analysis circuit. The dynamic routing is performed by multiplexor 410. In this example, the selection of the input of the multiplexor 410 is controlled by routing logic 412, which is also implemented within the reconfigurable partition of the programmable IC. In some other embodiments, the selection of the input of the multiplexor may be controlled by the logic analysis circuit 106 or by a testing device (e.g., 120) external to the programmable IC.

In a typical debugging process, after an error is detected, trace information is captured by testing circuitry and analyzed to determine a module of the circuit design that is the source of the error. The functionality of the module may be modified in an attempt to correct the error. The entire emulation system is again synthesized and a new netlist is generated for a second round of emulation. The programmable IC is configured with the new netlist and testing is repeated to ensure that the design error has been corrected. This process is repeated until all functional errors bugs are fixed. Irrespective of the extent of the modifications to the module, previous methods for emulation and debugging generate a new netlist for the complete emulation system and reprogram the entire programmable IC.

Reconfiguration of the entire programmable IC before every testing iteration contributes to a significant portion of emulation runtime. One or more embodiments may reduce debugging runtime by implementing modules of the design under test in respective reconfigurable partitions of programmable logic. When an error is detected during emulation, testing circuitry is configured to determine the module in error and stop testing of the determined module. The partition implementing the module in error may be later reconfigured, via partial reconfiguration, with an updated module without interrupting testing of other modules of the circuit design. In response to completing the partial reconfiguration of the partition, the testing circuit initiates testing with the updated module. Because the testing is not interrupted during reconfiguration, emulation runtime may be reduced.

Figure 5:
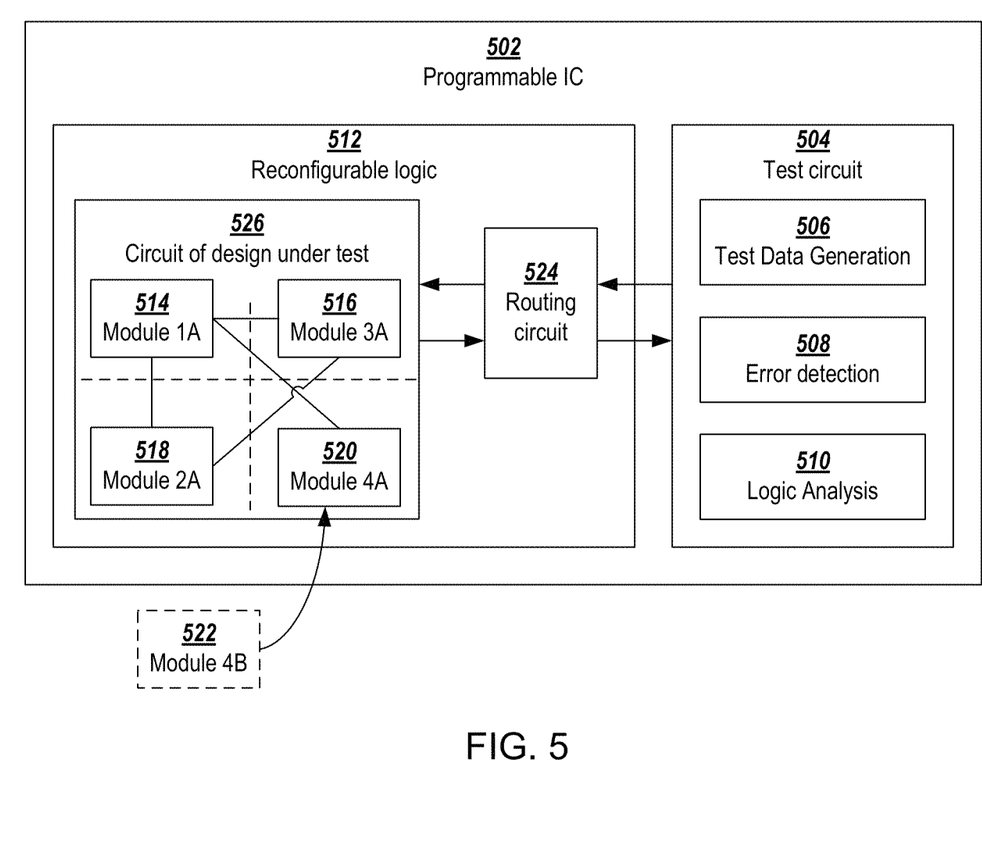
FIG. 5 illustrates an example emulation system implemented on a programmable IC, in accordance with one or more embodiments.

FIG. 5 illustrates an example emulation system implemented on a programmable IC in accordance with one or more embodiments. The emulation system includes a circuit 526 for emulating a design under test, test circuit 504, and a routing circuit 524 implemented in programmable logic of the programmable IC 502. The routing circuit 524 routes test input and probed signals between the test circuit and the design under test.

As described above, the test circuit 504 provides stimuli and observes and/or analyzes logic values in a circuit under test. The routing circuit 524 routes signals from test nodes of the circuit 526 to input nodes of the test circuit. In this example, test circuit 504 includes a test data generation circuit 506, an error detection circuit 508, and logic analysis circuit 510. The test data generation circuit 506 generates stimuli to be applied to various inputs or probe points of the circuit design under test. The error detection circuit 508 detects logical errors in the signals sampled from the test nodes. The logic analysis circuit 510 analyzes the signals sampled from the test nodes to capture timing data and/or determine the source of errors detected by the error detection circuit 508. It is recognized that in some embodiments, one or more of the test data generation, error detection, and/or logic analysis circuits may be implemented by an external test device that communicates with the test circuit via a communication interface (not shown) of the programmable IC 502.

The circuit 526 of the design under test and the routing circuit 524 are implemented in a reconfigurable partition of programmable logic of the programmable IC 502. Modules 514, 516, 518, and 520 of the circuit 526 are implemented in respective reconfigurable partitions of programmable logic (partitions separated by dashed lines). In response to detection of an error by the error detection circuit 508, the test circuit 504 is configured to determine the module that is the source of the error, halt testing of the module, and signal a user or external design tool of the error. After disabling testing of the module in error, the test circuitry is configured to continue testing of other modules of the circuit design under test. In one or more embodiments, this may be accomplished, e.g., by reconfiguring routing circuit 524 as described above with reference to FIGS. 1, 2 and 3. In some embodiments, testing of modules may be determined and controlled by the test circuit 504 or other external controller.

While other modules are being tested, a user or design tool may modify the identified module in error to correct the error. Because modules are implemented in separate partitions of reconfigurable logic, the modified module may be implemented, via partial reconfiguration, without halting testing of the other modules. In this illustrative example, module 4A (520) is identified as being the source of the error, and is modified by a design tool to generate a netlist for partial reconfiguration that implements module 4B (522). The partition of reconfigurable memory implementing module 4A (520) is reconfigured with the partial reconfiguration netlist to implement the updated module 4B (522) without interrupting testing of other modules of the circuit design. The emulation system is configured, in response to reconfiguration of a module, to restart testing of the updated module. This may be accomplished by reconfiguring the routing circuit as discussed above. Because the modules in error can be reconfigured without interrupting testing of other modules of the circuit design, emulation runtime can be reduced.

Figure 6:
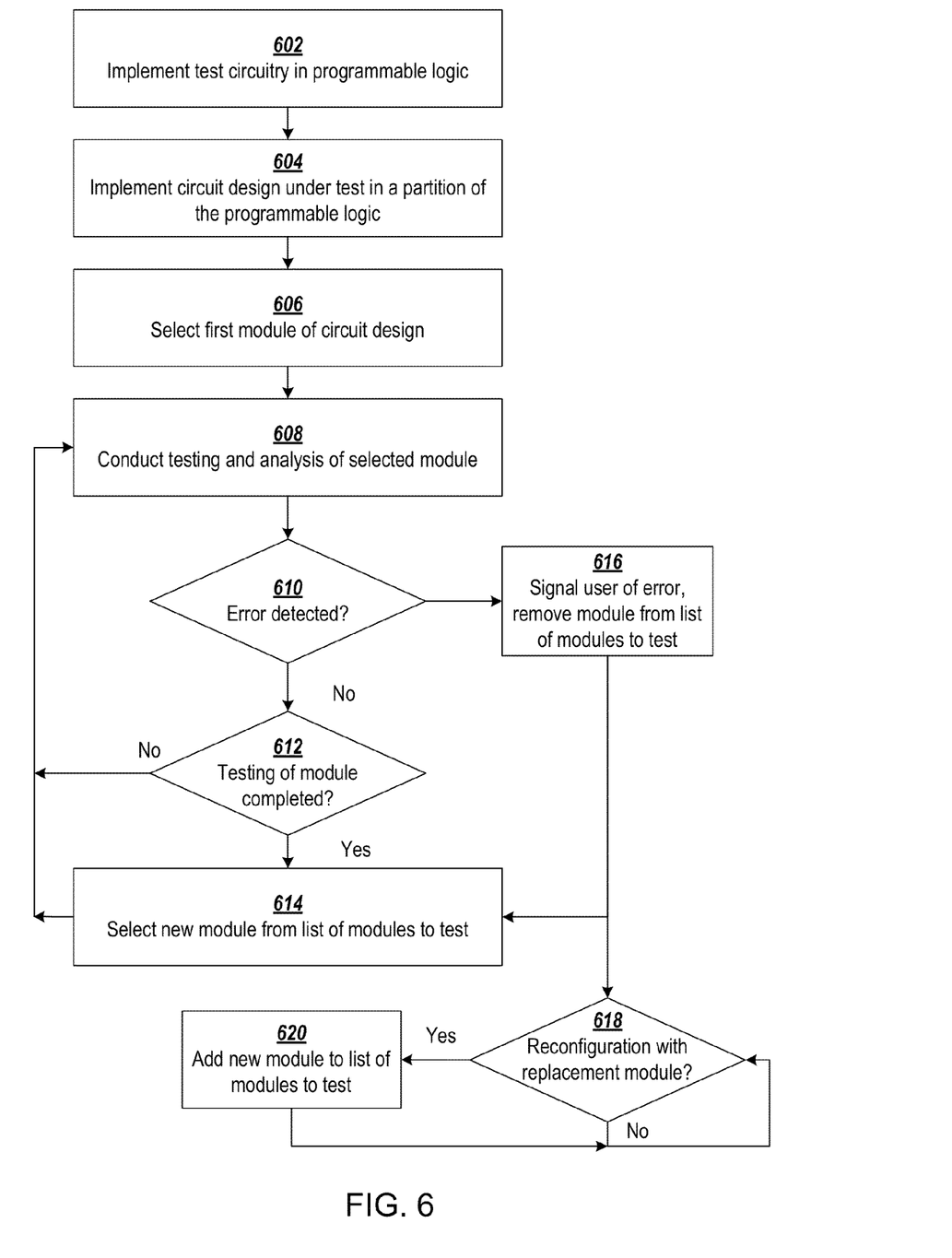
FIG. 6 shows a flowchart of a method for emulation of a circuit design, in accordance with one or more embodiments.

FIG. 6 shows a flowchart of a method for emulation of a circuit design, in accordance with one or more embodiments. Test circuitry is implemented in programmable logic of the programmable IC at block 602. A circuit design under test is implemented in a reconfigurable partition of the programmable logic at block 604. A first module of the circuit design is selected for in-circuit testing at block 606. Testing and analysis of the first module is performed at block 608.

If an error is detected at decision block 610 during testing of a module, the user or design tool controlling emulation is signaled at block 616 and the module is removed from the list of modules under test at block 616. After removing the module from the list, a new module is selected at block 614 for testing at block 608. In this manner, emulation may continue while a user or design tool debugs or modifies the failed module and reconfigures the reconfigurable partition of the programmable logic with an updated version of the module.

Concurrent with the selection and testing of another module at blocks 614 and 608, the module in error may be reconfigured, via partial reconfiguration, with an updated module. In response to detecting reconfiguration of a module at decision block 618, the updated module is added to the list of modules to test at block 620. When testing of the currently tested module is completed at block 612, the new updated module of the list is selected at block 614 for testing at block 608. The operations of blocks 618 and 620 may be performed concurrently with the operations of blocks 608-614. Testing and selection is repeated in this manner until testing of all modules in the list is completed.

In the example process shown in FIG. 6, modules are selected tested sequentially at blocks 606 and 608. It is understood that in some embodiments, the test circuitry may be configured to test multiple modules of the circuit design under test concurrently.

Figure 7:
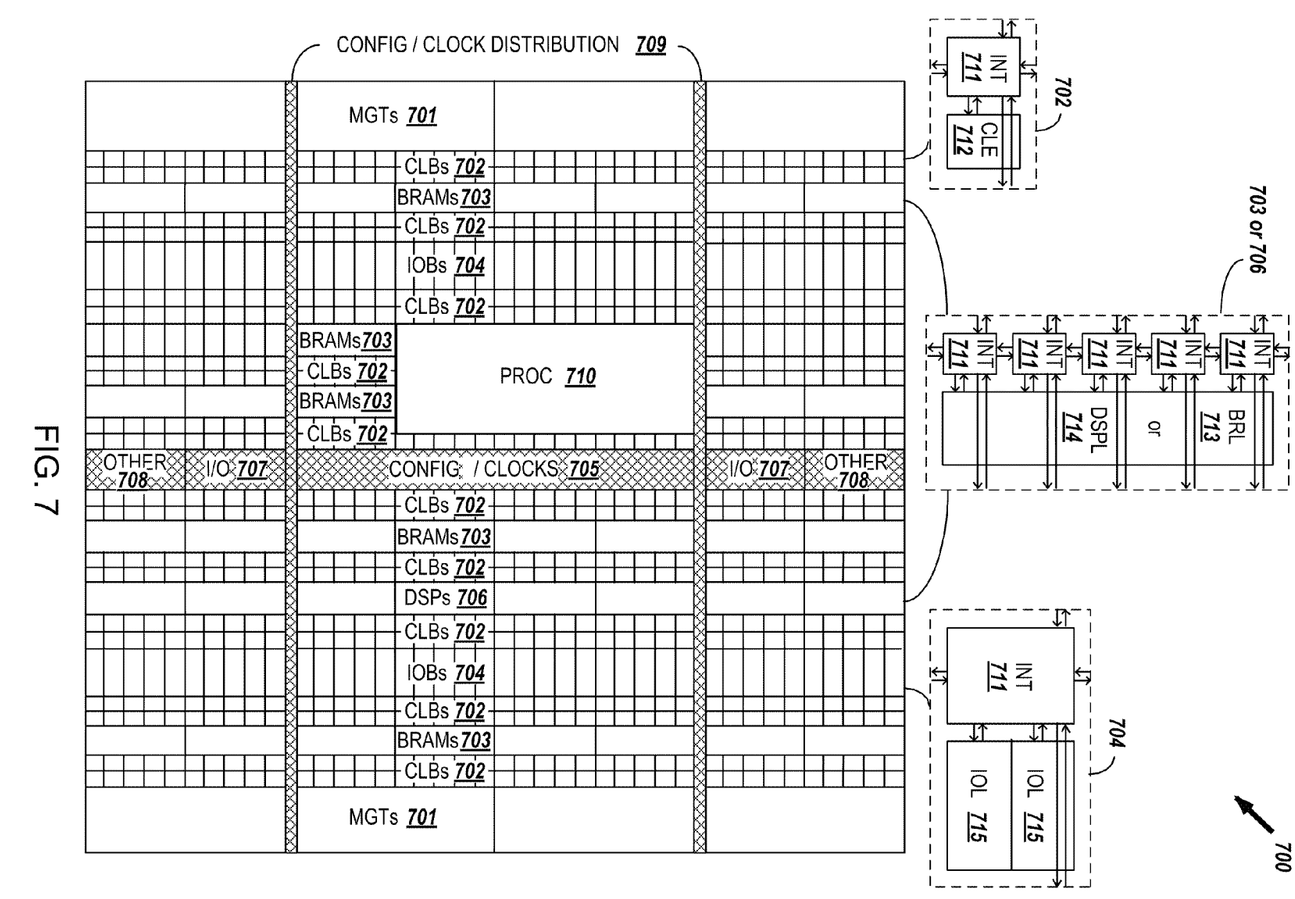
FIG. 7 is a block diagram of an example programmable integrated circuit that may be used for emulation of a circuit design, in accordance with one or more embodiments.

FIG. 7 is a block diagram of an example programmable integrated circuit that may be used for emulation of a circuit design in accordance with one or more embodiments. Emulation, as previously described, may be implemented on the programmable logic and interconnect resources of a programmable integrated circuit such as a field programmable gate array (FPGA), for example.

FPGAs can include several different types of programmable logic blocks in the array. For example, FIG. 7 illustrates an FPGA architecture (700) that includes a large number of different programmable tiles, including multi-gigabit transceivers (MGTs 701), configurable logic blocks (CLBs 702), random access memory blocks (BRAMs 703), input/output blocks (IOBs 704), configuration (including a configuration port) and clocking logic (CONFIG/CLOCKS 705), digital signal processing blocks (DSPs 706), specialized input/output blocks (I/O 707), for example, clock ports, and other programmable logic 708 such as digital clock managers, analog-to-digital converters, system monitoring logic, and so forth. Some FPGAs also include dedicated processor blocks (PROC 710).

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element INT 711 also includes the connections to and from the programmable logic element within the same tile, as shown by the examples included at the top of FIG. 7.

For example, a CLB 702 can include a configurable logic element CLE 712 that can be programmed to implement user logic plus a single programmable interconnect element INT 711. A BRAM 703 can include a BRAM logic element (BRL 713) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 706 can include a DSP logic element (DSPL 714) in addition to an appropriate number of programmable interconnect elements. An IOB 704 can include, for example, two instances of an input/output logic element (IOL 715) in addition to one instance of the programmable interconnect element INT 711. As will be clear to those of skill in the art, the actual I/O pads connected, for example, to the I/O logic element 715 are manufactured using metal layered above the various illustrated logic blocks, and typically are not confined to the area of the input/output logic element 715.

In the pictured embodiment, a columnar area near the center of the die (shown shaded in FIG. 7) is used for configuration, clock, and other control logic. Horizontal areas 709 extending from this column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear, to facilitate the efficient implementation of user logic.

Figure 8:
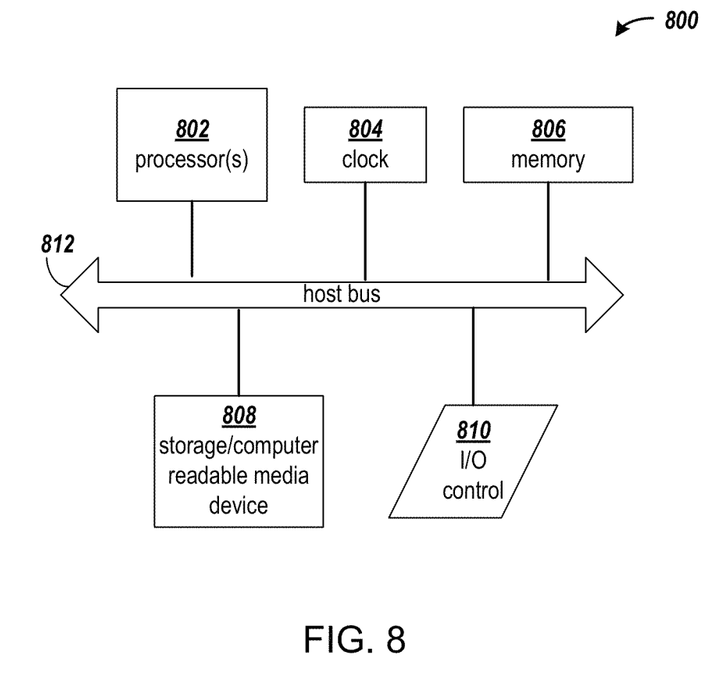
FIG. 8 is a block diagram of an example of a host computing arrangement for controlling emulation performed on a programmable IC, in accordance with one or more embodiments.

FIG. 8 is a block diagram of an example of a host computing arrangement for controlling emulation performed on a programmable IC. It will be appreciated that various alternative computing arrangements, including one or more processors and a memory arrangement configured with program code, would be suitable for hosting the processes and data structures and implementing the algorithms of the different embodiments. The computer code, comprising the processes of one or more embodiments encoded in a processor executable format, may be stored and provided via a variety of computer-readable storage media or delivery channels, such as magnetic or optical disks or tapes, electronic storage devices, or as application services over a network.

Processor computing arrangement 800 includes one or more processors 802, a clock signal generator 804, a memory unit 806, a storage unit 808, and an input/output control unit 810 coupled to a host bus 812. The arrangement 800 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 802 may be one or more general purpose processors, or a combination of one or more general purpose processors and suitable co-processors, or one or more specialized processors (e.g., RISC, CISC, pipelined, etc.).

The memory arrangement 806 typically includes multiple levels of cache memory, and a main memory. The storage arrangement 808 may include local and/or remote persistent storage, such as provided by magnetic disks (not shown), flash, EPROM, or other non-volatile data storage. The storage unit may be read or read/write capable. Further, the memory 806 and storage 808 may be combined in a single arrangement.

The processor arrangement 802 executes the software in storage 808 and/or memory 806 arrangements, reads data from and stores data to the storage 808 and/or memory 806 arrangements, and communicates with the programmable IC, which is used for emulation, using the input/output control arrangement 810. The input/output control arrangement 810 may be implemented using a number of protocols. For example, as mentioned above, the input/output control arrangement 810 may send/receive data to/from the programmable IC using the JTAG protocol, which is described in the IEEE 1149.1 specification. It is recognized that other communication protocols may be suitable for communication the programmable IC as well.

The functions of the computing arrangement 800 are synchronized by the clock signal generator 804. The resource of the computing arrangement may be managed by either an operating system (not shown), or a hardware control unit (not shown).

The embodiments of the present invention are thought to be applicable to a variety of applications involving emulation of circuit designs. Other aspects and embodiments will be apparent to those skilled in the art from consideration of the specification and practice of the invention disclosed herein. The embodiments may be implemented as one or more processors configured to execute software, as an application specific integrated circuit (ASIC), or as a logic on a programmable logic device. It is intended that the specification and illustrated embodiments be considered as examples only, with a true scope of the invention being indicated by the following claims.

What is claimed is:

1. A method of testing a circuit design using a programmable integrated circuit (IC), comprising:
    implementing the circuit design in programmable logic of the programmable IC, the circuit design having a set of test nodes at designated locations in the programmable IC;
    implementing a sampling circuit having a set of input nodes at designated locations in the programmable IC, the sampling circuit being configured and arranged to sample signals from the set of input nodes;
    implementing a first routing circuit in the programmable IC, the first routing circuit being configured and arranged to route signals from the designated locations of a first subset of the set of the test nodes to the designated locations of the set of input nodes of the sampling circuit;
    sampling signals from the first subset of test nodes using the sampling circuit;
    partially reconfiguring the programmable IC to implement a second routing circuit that replaces the first routing circuit, the second routing circuit being configured and arranged to route signals from the designated locations of a second subset of the set of test nodes to the set of input nodes of the sampling circuit; and
    sampling signals from the second subset of test nodes using the sampling circuit.

2. The method of claim 1, wherein implementing a first routing circuit in the programmable IC includes:
    implementing a third routing circuit in a first partition of the programmable IC, the third routing circuit being configured and arranged to route at least one signal from the one or more test nodes of the first subset to one or more of the set of input nodes; and
    implementing a fourth routing circuit in a second partition of the programmable IC, the fourth routing circuit being configured and arranged to route at least one signal from the one or more test nodes of the first subset to one or more nodes of the set of input nodes.

3. The method of claim 2, wherein partially reconfiguring the programmable IC to implement a second routing circuit includes reconfiguring only the first partition of the programmable IC.

4. The method of claim 2, wherein at least one of the one or more paths between the test nodes and the inputs of the sampling circuit is implemented by a combination of the third and fourth routing circuits.

5. The method of claim 1, wherein the first and second routing circuits each provide one or more paths between the test nodes and inputs of the sampling circuit using programmable routing resources of the programmable IC.

6. The method of claim 5, wherein partially reconfiguring the programmable IC to implement the second routing circuit includes reconfiguring the programmable IC to implement:
    a multiplexor coupled to one node of the set of input nodes of the sampling circuit and to a plurality of nodes of the second subset of the set of test nodes; and
    a control circuit coupled to the multiplexor, the control circuit being configured and arranged to cause the multiplexor to selectably route a signal from one of the plurality of the second subset of the set of test nodes to the one node of the set of input nodes of the sampling circuit.

7. The method of claim 6, wherein the control circuit is further configured and arranged to route signals from the plurality of the second subset of test nodes through the multiplexor to the one of the set of input nodes of the sampling circuit in a time division multiplexed manner.

8. The method of claim 1, further comprising:
displaying signals sampled from the first subset of test nodes to a user; and
wherein the partially reconfiguring the programmable IC to implement the second routing circuit is performed in response to one of a user command or a command from the sampling circuitry.

9. The method of claim 1, further comprising:
determining critical timing paths of the circuit design;
identifying one or more test nodes on the critical timing path; and
wherein the partially reconfiguring the programmable IC to implement the second routing circuit includes generating, in response to identifying that the first subset of test nodes includes one of the one or more test nodes, a circuit design of the second routing circuit by modifying a circuit design of the first routing circuit to include one or more pipeline stages on a signal path that connects the one test node on the critical timing path to a node of the sampling circuit.

10. The method of claim 1, wherein the implementing of the sampling circuit includes implementing logic analysis circuitry in programmable logic.

11. The method of claim 1, wherein the implementing of the sampling circuit includes implementing one or more outputs coupled to external pins of the programmable IC.

12. A system for testing a circuit design, comprising:
a programmable integrated circuit (IC);
a computing arrangement coupled to the programmable IC, wherein the computing arrangement is configured to execute instructions that perform operations including:
implementing the circuit design in programmable logic of the programmable IC, the circuit design having a set of test nodes at designated locations in the programmable IC;
implementing a sampling circuit having a set of input nodes at designated locations in the programmable IC, the sampling circuit being configured and arranged to sample signals from the set of input nodes;
implementing a first routing circuit in the programmable IC, the first routing circuit being configured and arranged to route signals from the designated locations of a first subset of the set of the test nodes to the designated locations of the set of input nodes of the sampling circuit;
after sampling signals from the first subset of test nodes using the sampling circuit, partially reconfiguring the programmable IC to implement a second routing circuit that replaces the first routing circuit, the second routing circuit being configured and arranged to route signals from the designated locations of a second subset of the set of test nodes to the set of input nodes of the sampling circuit.

13. The system of claim 12, wherein implementing a first routing circuit in the programmable IC includes:
implementing a third routing circuit in a first partition of the programmable IC, the third routing circuit being configured and arranged to route at least one signal from the one or more test nodes of the first subset to one or more of the set of input nodes; and
implementing a fourth routing circuit in a second partition of the programmable IC, the fourth routing circuit being configured and arranged to route at least one signal from the one or more test nodes of the first subset to one or more nodes of the set of input nodes.

14. The system of claim 13, wherein partially reconfiguring the programmable IC to implement a second routing circuit includes reconfiguring only the first partition of the programmable IC.

15. The system of claim 12, wherein the first and second routing circuits each provide one or more paths between the test nodes and inputs of the sampling circuit using programmable routing resources of the programmable IC.

16. The system of claim 13, wherein at least one of the one or more paths between the test nodes and the inputs of the sampling circuit is implemented by a combination of the third and fourth routing circuits.

17. The system of claim 15, wherein partially reconfiguring the programmable IC to implement the second routing circuit includes reconfiguring the programmable IC to implement:
a multiplexor coupled to one node of the set of input nodes of the sampling circuit and to a plurality of nodes of the second subset of the set of test nodes; and
a control circuit coupled to the multiplexor, the control circuit being configured and arranged to cause the multiplexor to selectably route a signal from one of the plurality of the second subset of the set of test nodes to the one node of the set of input nodes of the sampling circuit.

18. The system of claim 17, wherein the control circuit is further configured and arranged to route signals from the plurality of the second subset of test nodes through the multiplexor to the one of the set of input nodes of the sampling circuit in a time division multiplexed manner.

19. The system of claim 12, the operations further comprising:
determining critical timing paths of the circuit design;
identifying one or more test nodes on the critical timing path; and
wherein the partially reconfiguring the programmable IC to implement the second routing circuit includes generating, in response to identifying that the first subset of test nodes includes one of the one or more test nodes, a circuit design of the second routing circuit by modifying a circuit design of the first routing circuit to include one or more pipeline stages on a signal path that connects the one test node on the critical timing path to a node of the sampling circuit.

20. The system of claim 12, wherein the implementing of the sampling circuit includes implementing logic analysis circuitry in programmable logic.

* * * * *